(12) United States Patent
Morin et al.

(10) Patent No.: US 11,792,487 B2
(45) Date of Patent: Oct. 17, 2023

(54) AUDIO DEVICE WITH LEARNING AND ADAPTIVE QUIET MODE CAPABILITIES

(71) Applicant: InterDigital Madison Patent Holdings, SAS, Paris (FR)

(72) Inventors: Thomas Morin, Rennes (FR); David Drugeon-Hamon, Rennes (FR); Goulven Querre, Noyal sur Vilaine (FR)

(73) Assignee: InterDigital Madison Patent Holdings, SAS, Paris (FR)

(*) Notice: Subject to any disclaimer, the term of this patent is extended or adjusted under 35 U.S.C. 154(b) by 11 days.

(21) Appl. No.: 17/279,503

(22) PCT Filed: Sep. 24, 2019

(86) PCT No.: PCT/EP2019/075747
§ 371 (c)(1),
(2) Date: Mar. 24, 2021

(87) PCT Pub. No.: WO2020/064759
PCT Pub. Date: Apr. 2, 2020

(65) Prior Publication Data
US 2021/0400355 A1    Dec. 23, 2021

(30) Foreign Application Priority Data

Sep. 25, 2018   (EP) .................................... 18306244

(51) Int. Cl.
*H04N 21/439* (2011.01)
*H04N 21/485* (2011.01)
(Continued)

(52) U.S. Cl.
CPC ..... *H04N 21/4852* (2013.01); *H04N 21/2187* (2013.01); *H04N 21/4394* (2013.01); *H04N 21/4398* (2013.01); *H04N 21/44008* (2013.01)

(58) Field of Classification Search
CPC .......... H04N 21/4852; H04N 21/2187; H04N 21/4394; H04N 21/4398; H04N 21/44008
See application file for complete search history.

(56) References Cited

U.S. PATENT DOCUMENTS

2008/0095385 A1   4/2008  Tourwe
2009/0226152 A1*  9/2009  Hanes ................. H04N 21/4341
                                                386/353
(Continued)

FOREIGN PATENT DOCUMENTS

CN          1981433 A      6/2007
CN        105872750 A      8/2016
(Continued)

OTHER PUBLICATIONS

CN105872750A TR EN machine full Mar. 22, 2021.
(Continued)

*Primary Examiner* — Jefferey F Harold
*Assistant Examiner* — Charles N Hicks
(74) *Attorney, Agent, or Firm* — CONDO ROCCIA KOPTIW LLP

(57) ABSTRACT

An apparatus and method are provided for controlling the volume of a content. In one embodiment, sound associated with a content is received as well as a request for a volume change associated with the content. An equalization ratio is then obtained based on an amplification and a compression parameter. It is then analyzed whether a volume change will cause a coordinate change in the amplifier or compression levels associated with the content. If a volume change will cause a coordinate change in the amplifier or compression levels associated with the content, the volume change is limited.

22 Claims, 11 Drawing Sheets

(51) Int. Cl.
*H04N 21/2187* (2011.01)
*H04N 21/44* (2011.01)

(56) References Cited

U.S. PATENT DOCUMENTS

| | | | |
|---|---|---|---|
| 2011/0102674 A1* | 5/2011 | Mertens | H04N 21/4398 |
| | | | 348/E9.034 |
| 2011/0115766 A1* | 5/2011 | Kerofsky | H04N 21/42202 |
| | | | 345/207 |
| 2013/0046545 A1 | 2/2013 | Iwanaga | |
| 2014/0169751 A1* | 6/2014 | Weast | H04N 21/4436 |
| | | | 386/200 |
| 2014/0219476 A1 | 8/2014 | Barbulescu et al. | |
| 2018/0227607 A1* | 8/2018 | Kang | H04N 21/2408 |
| 2019/0014435 A1* | 1/2019 | Baijal | H04R 5/04 |

FOREIGN PATENT DOCUMENTS

| | | |
|---|---|---|
| JP | 2013041197 A | 2/2013 |
| KR | 20060098140 A | 9/2006 |
| WO | WO 2006047600 A1 | 5/2006 |

OTHER PUBLICATIONS

KR20060098140 TR EN machine full Mar. 22, 2021.
https://en.wikipedia.org/wiki/Decibel_retrieved_05Sep2017.
https//en.wikipedia.org_Loudness_War_retrieved_17Sep2017.

* cited by examiner

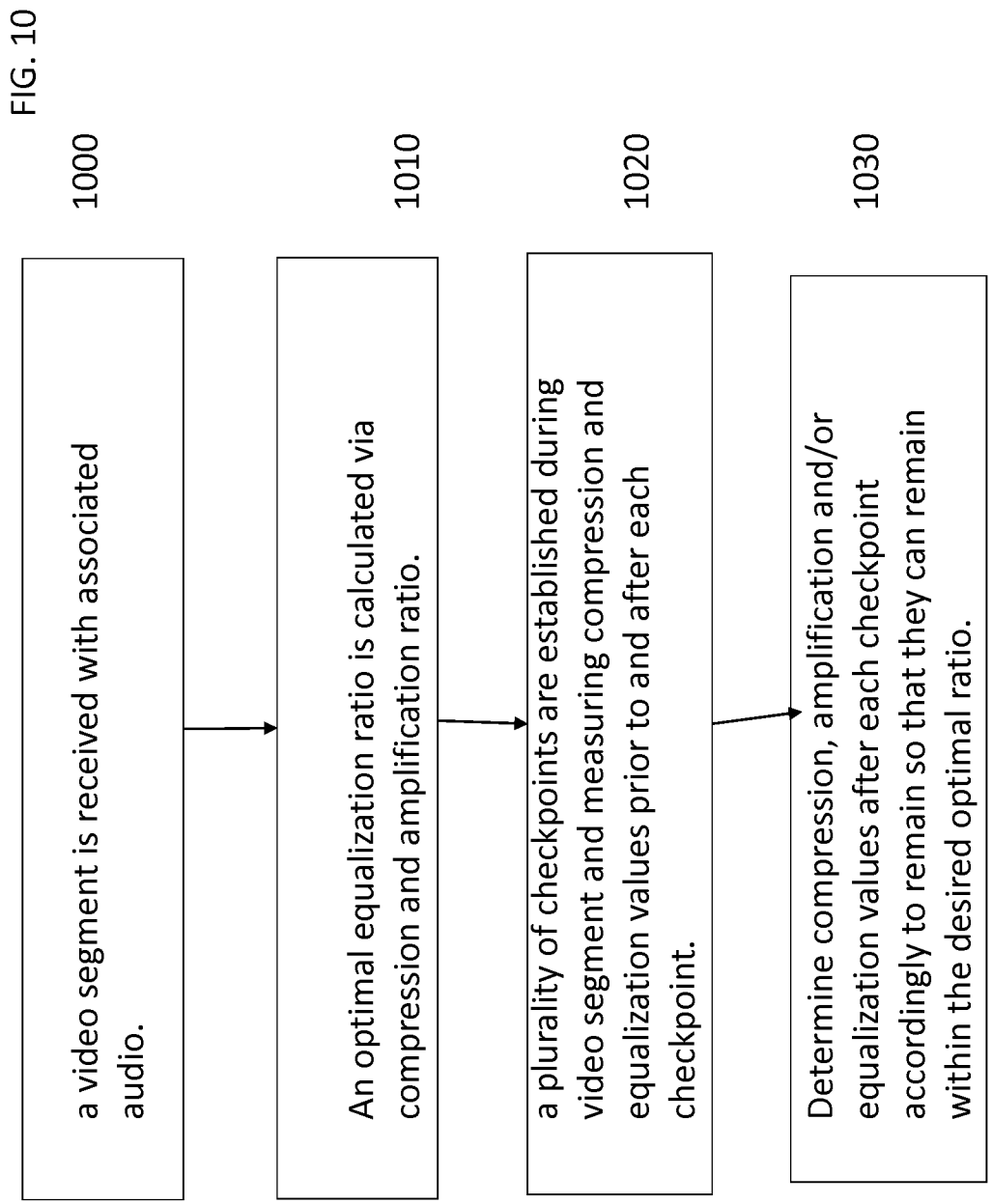

AUDIO DEVICE WITH LEARNING AND ADAPTIVE QUIET MODE CAPABILITIES

CROSS REFERENCE TO RELATED APPLICATIONS

This application is the national stage entry under 35 U.S.C. § 371 of International Application PCT/EP2019/075747, filed Sep. 24, 2019, which was published in accordance with PCT Article 21(2) on Jun. 4, 2020 in English and which claims the benefit of European patent application 18306244.7, filed Sep. 25, 2018.

TECHNICAL FIELD

The present embodiments relate generally to audio compression and in particular to providing audio control based on user habits and provided content.

BACKGROUND

This section is intended to introduce the reader to various aspects of art, which may be related to various aspects of the embodiments described and/or claimed below. This discussion is believed to be helpful in providing the reader with background information to facilitate a better understanding of the various aspects. Accordingly, it should be understood that these statements are to be read in this light, and not as admissions of prior art.

Dynamic range compression uses audio processing to reduce the volume of loud sounds. Alternatively, it can also amplify quiet sounds by narrowing and compressing the audio signal's dynamic range. Dynamic range compression reduces loud sounds over a certain threshold while letting quiet sounds remain unaffected. It can also increase the loudness of sounds below a threshold while leaving louder sounds unchanged. In this way, a compressor can be used to reduce the dynamic range of source material and allow the source signal to be recorded on a medium with a more limited dynamic range than that of the source signal. This also allows the character of an instrument to be changed during the processing.

Dynamic range compression can also be used to increase the perceived volume of audio tracks, or to balance the volume of highly-variable music. This improves the quality of audio content even when played in noisy environments. In addition, sound volume can be manipulated through compression. For example, many people with close neighbors or children may use the feature "night audio mode" also known as auto volume or sound compression. Nonetheless, it is difficult to improve quality or manipulate volume because performing useful dynamic range compression requires the adjustment of many parameters. In most advanced systems there are least two parameters that control volume, both sound compression, that can be adjusted from no to low or medium and high, or voice clarity, that can be turned on or off. These features mainly aim at reducing the difference of volume between speech sequences and explosion ones. The user uses this feature to listen quietly to the TV. At low volume, it is desirable to improve the voice clarity to improve comprehension. These menus are generally hidden and the user may not have the audio science skills to manipulate the compression level. It should be a simple feature, but the real problem is it is not working effectively and often not at all. Sometimes it behaves as if the user has just decreased manually the volume and sometimes it damages the sound quality especially when watching videos with a lot of music. Sometimes it increases abnormally small sounds, such as footsteps. Most of the time, it does nothing, the user still has to decrease the volume when a plane takes off and has to increase it just afterwards to hear what the actor is whispering. If the television set is connected to a Hi-Fi audio system, the problem gets bigger because the audio response is better and the walls still rumble in quiet mode.

Consequently, since the adjustment of these and other audio parameters are difficult and require much skill, an apparatus or a method that determines and supplies a set of audio dynamic range compression parameters to an audio compressor is needed. Such parameters may include automatic adjustment and computation of such parameters as noise gate, threshold, and ratio parameters so that the user of a media editing application can quickly and easily accomplish useful dynamic range compression.

SUMMARY

An apparatus and method are provided for controlling the volume of a content. In one embodiment, sound associated with a content is received as well as a request for a volume change associated with the content. An equalization ratio is then obtained based on an amplification and a compression parameter. It is then analyzed whether a volume change will cause a coordinate change in the amplifier or compression levels associated with the content. If a volume change will cause a coordinate change in the amplifier or compression levels associated with the content, the volume change is limited.

Additional features and advantages are realized through similar techniques and other embodiments and aspects are described in detail herein and are considered a part of the claims. For a better understanding of advantages and features, refer to the description and to the drawings.

BRIEF DESCRIPTION OF THE DRAWINGS

The present disclosure will be better understood and illustrated by means of the following embodiments and execution examples, in no way limiting, with reference to the appended figures on which.

Wherever possible, the same reference numerals will be used throughout the figures to refer to the same or like parts.

DESCRIPTION

It is to be understood that the figures and descriptions have been simplified to illustrate elements that are relevant for a clear understanding, while eliminating, for purposes of clarity, many other elements found in typical digital multimedia content delivery methods and systems. However, because such elements are well known in the art, a detailed discussion of such elements is not provided herein. The disclosure herein is directed to all such variations and modifications known to those skilled in the art.

Figure 1:
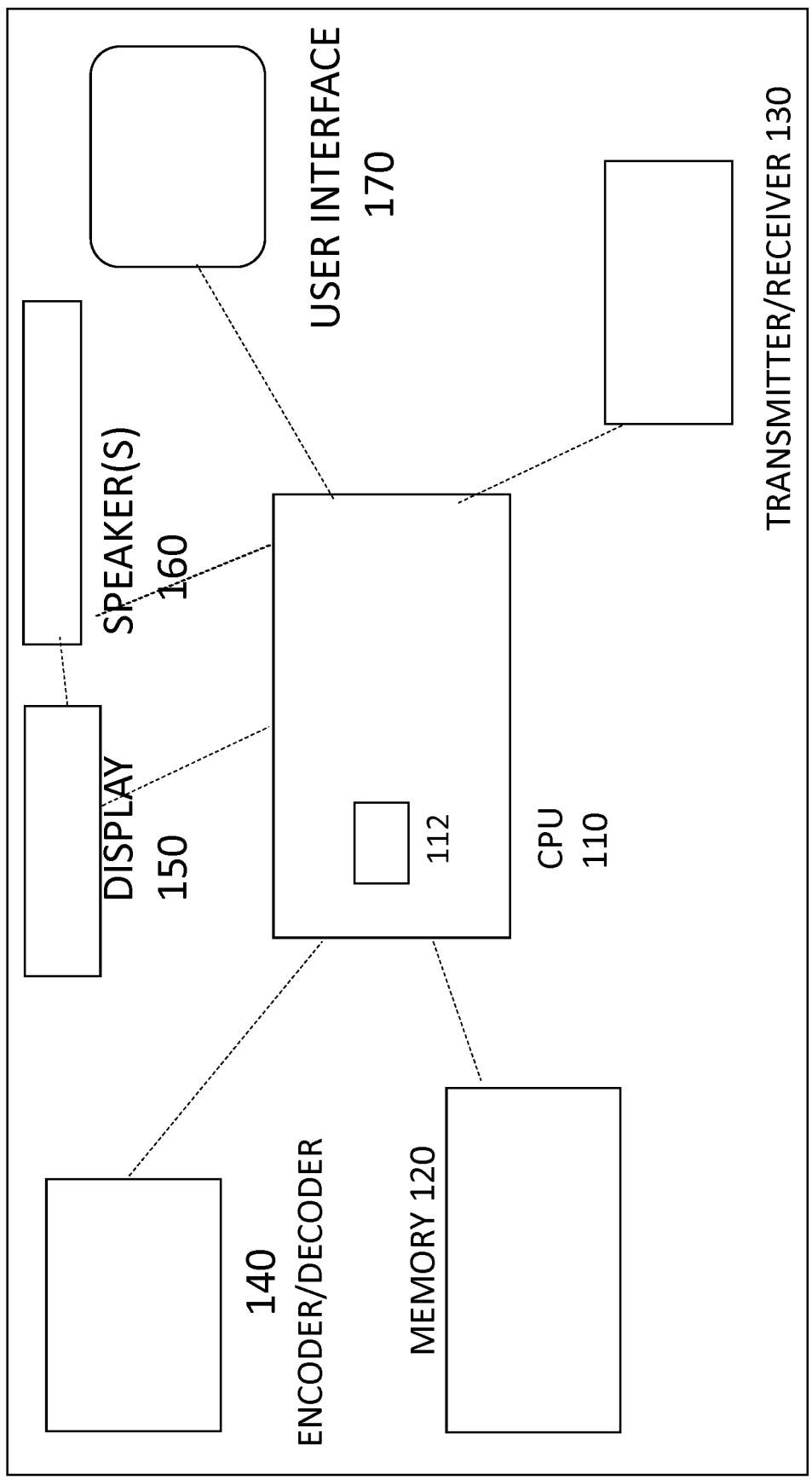
FIG. 1 schematically represents a block diagram of a system with audio control capabilities according to one embodiment.

FIG. 1 is a block diagram illustrating a system 100 that can receive and display content. This system can be a sophisticated home theater or a mobile tablet or smart phone. In the exemplary embodiment shown, the system 100 may illustrate configuration of a digital television receiving device or a home theater device in a home theater system. The system 100 can include a decoder/encoder 140, a display 150 with integrated or alternatively external speakers 160, a transmitter/receiver 130 such as an HDMI type, a CPU 110 having at least a processor 112, a memory 120, and a user interface 170 such as a remote control or other devices. The system 100 can alternatively also include a remote control, additional light receiver, a tuner, or other devices as can be understood by those skilled in the art. The tuner, in turn, can receive, tune, and demodulate a digital broadcast signal in terrestrial digital broadcasting, digital satellite broadcasting, or the like, and outputs a video signal and an audio signal having a selected content. There can also be a demodulator that can decode a video signal and an audio signal output from the tuner, and output video data and audio data. The display can display video or broadcast content on a screen and there can be an audio output associated with internal or external speakers.

The user interface 170 such as the remote control device can include a sound volume operation button for a sound volume operation. In traditional systems, a remote control often includes a sound volume operation, such as sound volume adjustment, mute setting, and mute release. The sound volume operation button includes a sound volume up button for increasing a sound volume, a sound volume down button for decreasing a sound volume, and a mute button for issuing instructions to perform mute setting and mute release. In this embodiment, no matter what the user interface may be, a user can at least perform sound volume operations of the speakers.

The CPU 110 controls the sound volume of the audio output from the speakers and in general controls other operational components. The memory stores status data including data relating to sound volume control associated with current and previous displayed or broadcast content. The sound volume control status data can include maximum sound volume value data, sound volume setting value data, and mute setting status data associated with programs or genres of programs and user habits associated with them.

In one embodiment, the maximum sound volume value data is data representing a maximum value in a sound volume adjustable range for a device and may include minimum sound volume value data representing a minimum value in the sound volume adjustable range for the device.

Figure 2A:
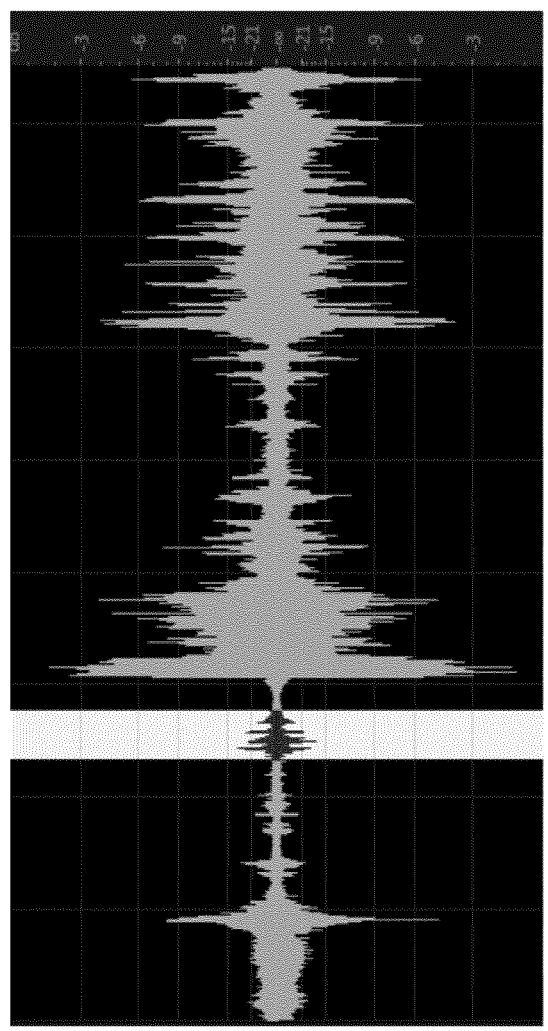
FIG. 2A illustrates a general overview of a sound wave, extracted from a science fiction movie clip.

FIG. 2A illustrates a general overview of a sound wave, extracted from a science fiction movie clip. The sound clip contains both loud and soft sounds and it can be used to extrapolate some of the analysis that is to follow. As will be discussed in further detail, generic compression alone cannot be used to provide quiet sounds. In controlling sound, the main objective is to provide less dynamics between the extremes of sounds or, in other words, smooth the volumes so there are smaller differences between speech and sudden noises. The sudden noises in a movie package, such as the one demonstrated, may include both music and other noises such as screams and explosions, for instance, that will have a jarring sudden effect on the ears.

Referring still to FIG. 2A, the wave provided includes a mixture of shotgun and explosion noises, as well as loud music. The white area depicts someone talking which includes a muted type of waveform in comparison to other areas. Most naturally, in quiet environments where there is speech, the user often turns up the volume so that the words can easily be distinguished.

Some devices uses features such as "night audio mode" or "auto volume" that utilizes sound compression to control volume spikes. These conventional devices often at least use sound compression and voice clarity (speech) to improve listening understandability and prevent spikes. For example, adjustments can be made as follows:

Sound compression→none|low|medium|high

Voice clarity→on|off

These features mainly aim at reducing the difference of volume between speech sequences and explosion ones. The user uses this feature to listen quietly to the TV. At a low volume, it's desirable to improve the voice clarity to improve comprehension. These menus are generally hidden and the user may not have the audio science skills to manipulate the compression level. It should be a simple feature: "quiet audio to on |off".

While these features suggest a solution, the reality is that the prior art devices do not work well and cannot reliably improve the situation. In many cases, the end result is an overall decrease of the volume (as if done manually). In other instances, the compression manipulation results in damage to the sound quality, especially when watching videos with a lot of music embedded. At other times, a sudden increase of an abnormally small sound (such as footsteps) can create an unexpected result. In some instances, the end result is not noticeable at all and the user has to decrease the volume manually during loud noises and increase it when regular speech turns into a whisper. The problem becomes more difficult when a Hi-Fi audio system is used, or connected to other devices such as television sets, as this causes a better audio response, which causes all sorts of issues, including vibration of the walls even when the sound is set to be in the quiet mode. To understand the reason behind these issues, some other audio wave forms can be explored.

Figure 2B:
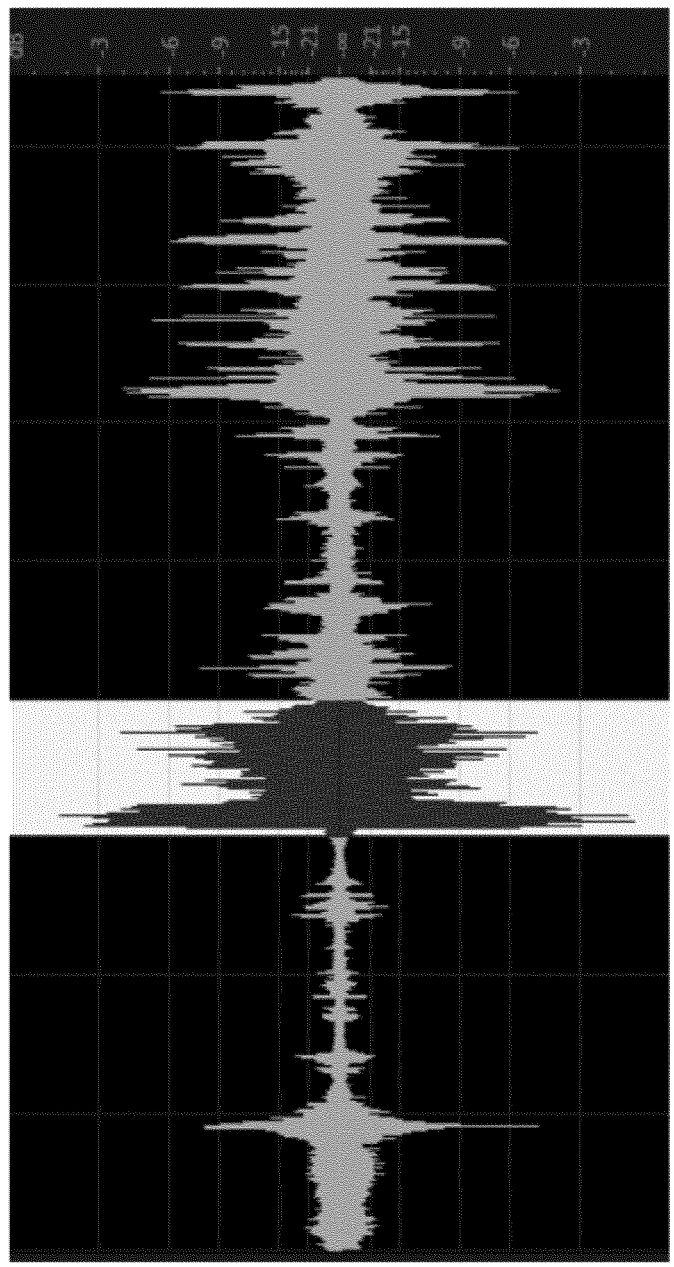
FIG. 2B provides an illustration of a waveform having discernable speech with higher volumes and the audio compression according to one embodiment.
Figure 3:
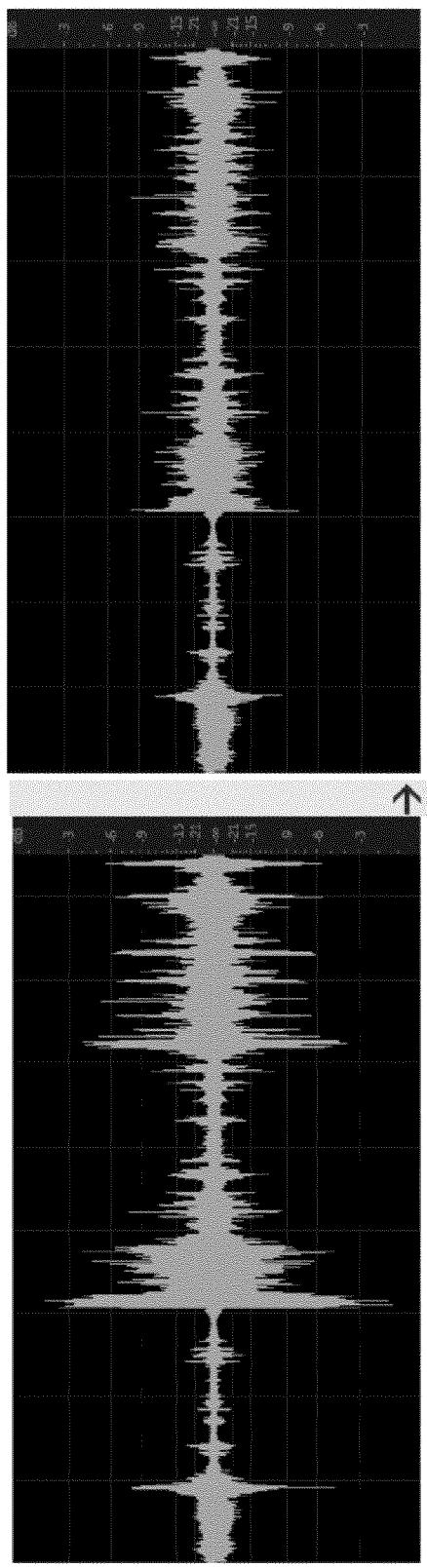
FIG. 3 is an illustration of a manipulated waveform according to one embodiment.

FIG. 2B provides a discernable speech with higher volumes and the audio compression is applied accordingly. FIG. 2B can be used as a reference point for discernable speech volume. FIG. 3 provides a manipulated waveform. The waveform on the left hand side is analogous to the one provided in FIG. 2B, while the one on the right hand side provides an altered wave where the speech areas have an increased volume or at least remain substantially the same where the jarring areas (i.e., an explosion) have decreased in intensity and are more in keeping with the speech volume. To ease understanding, the actual results of this wave length as adjusted and applied in a mono-band compression is as follows as indicated by the parameters:

```
Threshold −15 dB
Ratio 20:1
Attack 20 ms
Release 1000 ms
Gain 0 dB
```

In other words, every sound above −15 dB is reduced by a 20 ratio. The compression is applied after 20 ms of loud (high/heavy) sounds persist and canceled after 1000 ms of acceptable sound levels are detected. The whole result is not boosted to compensate the volume loss as there is no gain. While this example uses data that is specific, other parameters can be used. The 3 last parameters can be generic but there needs to be a particular set threshold and an appropriate ratio (here, "−15 dB" and the "20:1"). In this particular example, the average speech level was set through firsthand experience as a reference point. There is a methodology used later in this description (as will be discussed) that is in keeping with where the wave peaks should be adjusted (here, 20 times reduced).

Figure 4:
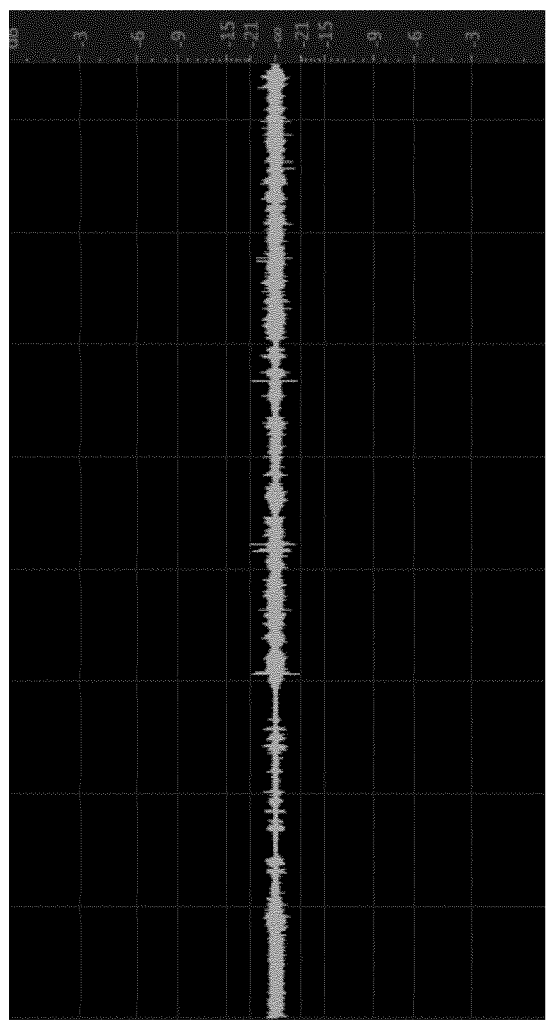
FIG. 4 is an illustration of muted signal amplitude according to one embodiment.

With a video file, the whole wave form can be analyzed to get the most relevant parameters. This would be a first great optimization on devices such as smart television sets, but it would take time before playing the video, and it's not possible in real-time for a Live/VoD/Replay/Radio stream. It may not be a good idea to always apply an extreme compression (−30 dB, ×30) adjustment as shown in FIG. 3. In the example of FIG. 4, whatever the original signal amplitude and dynamics are, everything ends at −30 db. Speech and explosions are at the same volume level as noises which were originally at −30 dB. Therefore, certain noises, such as a buzz or wind or other similar background sounds, may become annoying.

Figure 5:
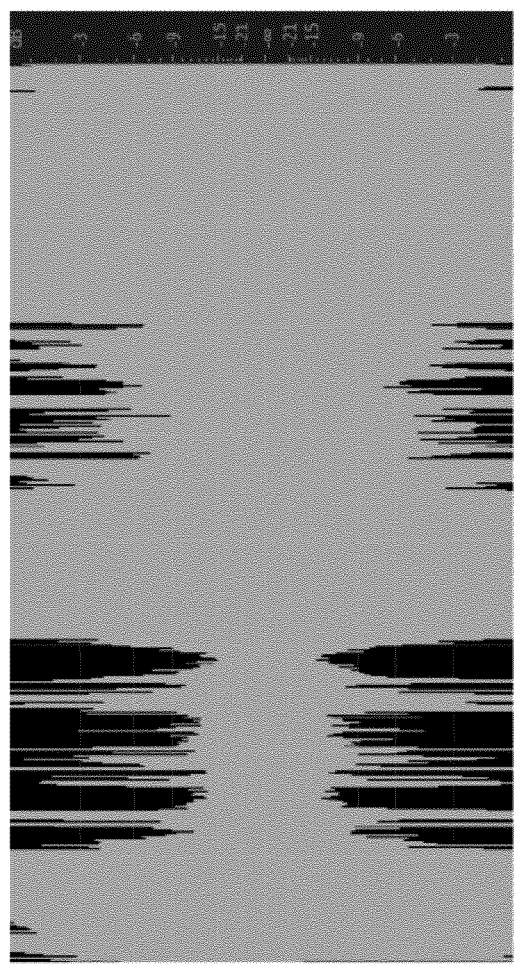
FIG. 5 is an illustration of an amplified signal according to one embodiment.

The contrary scenario is not any better either, as shown in FIG. 5. In FIG. 5, amplifying the track instead of compressing it would introduce distortion everywhere. The examples provided in FIGS. 4 and 5, delineate the weakness of some of the prior art systems even more conclusively. For example, the following result provides audio frequencies can be split in 8 parts:

```
0-25 Hz extreme bass
25-120 Hz bass
120-350 Hz low medium
350-2k Hz medium
2k-8k Hz high medium
8k-12k Hz treble
12k-20k Hz high treble
More than 20 kHz ultrasound
```

Most traditional prior art systems do not even provide an option that allows for voice clarity. However, voice clarity is only a starting point on providing more comprehensive options. In one embodiment, technology that already exists in everyday consumer devices can be used to achieve this end. For example, ultrasound frequencies may be used but are not captured when making a movie, whereas extreme-bass frequencies are provided and can be used. In one example, Hi-Fi systems and sound bars can be used to correctly render low basses. Bass sounds have a long wavelength that makes them easily cross walls with nearly no loss. Even if inaudible, the extreme bass frequencies can also make walls rumble, such that they should be removed.

Figures 6A, 6B:
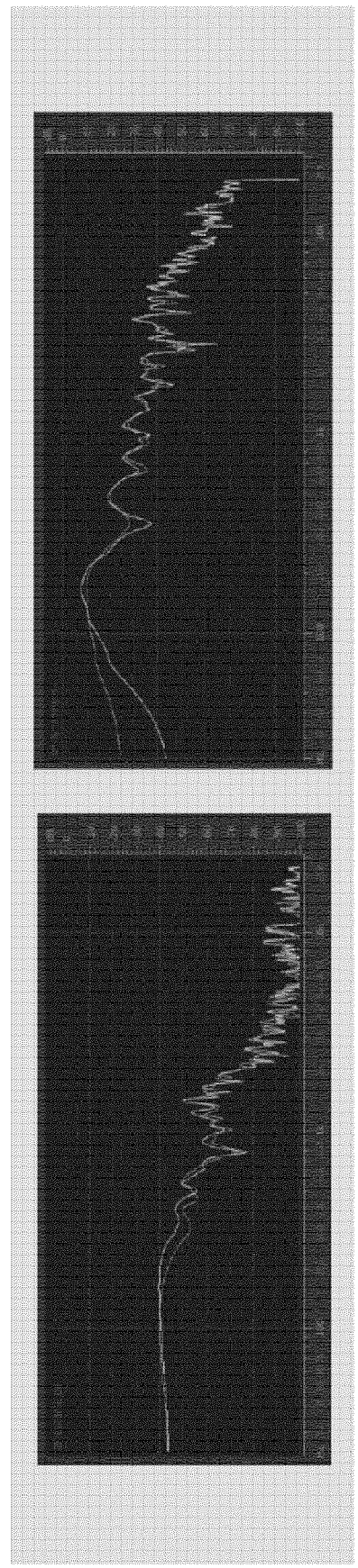
FIGS. 6A and 6B provide a respective frequency analysis of a moment of a speech (6A) and a moment of an explosion (6B) in one example as per one embodiment.

FIGS. 6A and 6B provide a respective frequency analysis of a moment of a speech (6A) and a moment of an explosion (6B) in one example to provide better understanding. In both instances, as captured by the figures, both examples display a heavy level of bass. In terms of equalization, for these examples, the following treatments can be used:

A radical HPF (High Pass Filter) to remove extreme bass,
A preventive smooth LPF (Low Pass Filter) to remove useless very-high-treble and ultrasound,
An EQ to improve speech comprehensibility.

Figure 7:
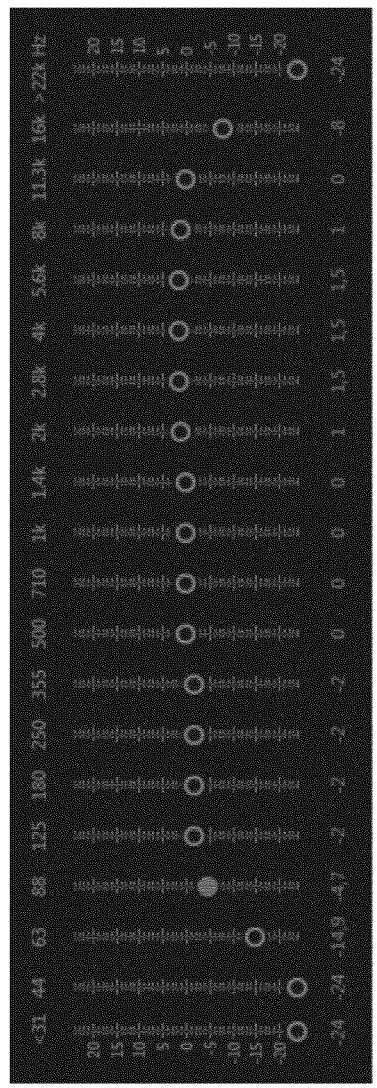
FIG. 7 schematically represents a measurement device displaying bass levels to be used in conjunction with FIGS. 6A and 6B.

This can be further demonstrated by the measurements shown in FIG. 7.

Figures 8A, 8B:
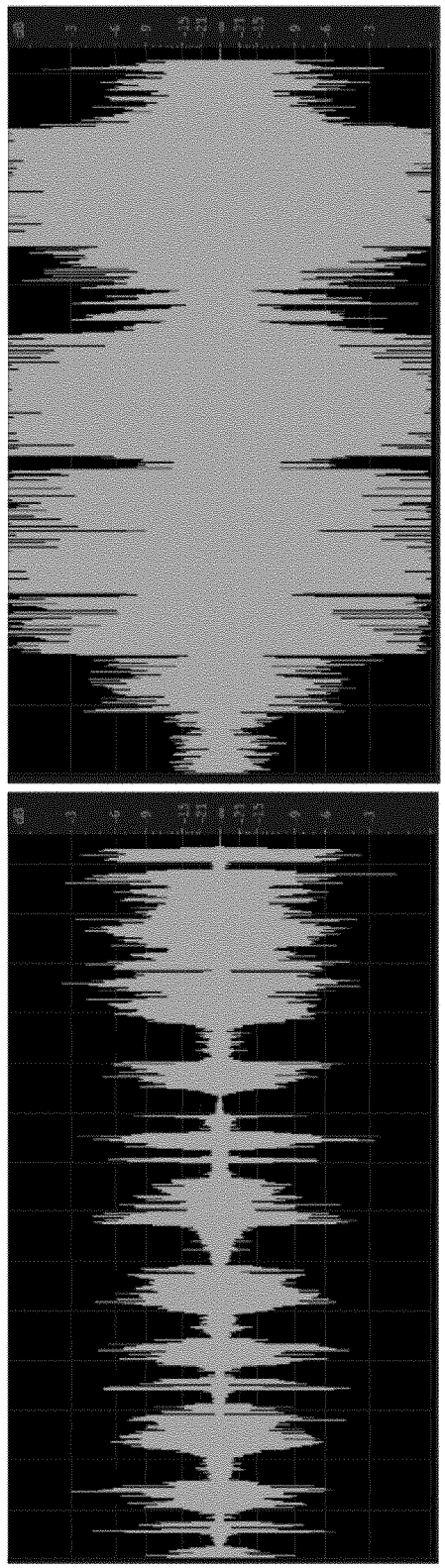
FIGS. 8A and 8B demonstrate music file examples, with FIG. 8A providing for a sample wave capture of a classical music that favors dynamics and FIG. 8B providing a RnB song that favors loudness.

FIGS. 8A and 8B demonstrate music file examples. Many advanced systems, including television systems, allow for receiving, storing and broadcasting of music files, sometimes using USB, Bluetooth, LAN or other types of connections. In some instances, it may be relevant to treat these files as video files, especially in quiet mode. However, this may not be appropriate in all cases.

Referring still to FIGS. 8A and 8B, FIG. 8A provides for a sample wave capture of a classical music that favors dynamics, while FIG. 8B provides for a RnB type of song that favors loudness. At low volume, such as an instance where a parent is listening to music with a sleeping child in the room, the music may become inaudible during calm sequences which requires the volume to be turned up. In contrast, the RnB sound still provides potent volume at audible ranges even when the volume is turned down to low level. This is because with RnB songs, the music is already compressed (and normalized to 0 dB=max), so the volume needs to be set to an appropriate level only once for all iterations. However, other types of music files are not provided on a real-time basis (such as the classical type demonstrated here) and have to be pre-processed and the system (TV system etc.) should have the capability to check if most of wave peaks are between (0 and −1 dB). In such a case, quiet mode should be deactivated.

Learning Adaptive TV Quiet Mode—If the TV manufacturer knows the built-in audio amplifier, the system knows
The audio power of the source signal (in dB)→Source Audio Signal SAP
The audio power of the amplifier (in dB or other)→Amp Audio Signal→AAP
They can be aggregated to define a User-Felt Audio Power→UFAP dB scale

| dB | Power ratio | Amplitude ratio |
|---|---|---|
| 100 | 10 000 000 000 | 100 000 |
| 90 | 1 000 000 000 | 31 623 |
| 80 | 100 000 000 | 10 000 |
| 70 | 10 000 000 | 3 162 |
| 60 | 1 000 000 | 1 000 |
| 50 | 100 000 | 316.2 |
| 40 | 10 000 | 100 |
| 30 | 1 000 | 31.62 |
| 20 | 100 | 10 |
| 10 | 10 | 3.162 |
| 6 | 3.981 ≈ 4 | 1.995 ≈ 2 |
| 3 | 1.995 ≈ 2 | 1.413 ≈ $\sqrt{2}$ |
| 1 | 1.259 | 1.122 |
| 0 | 1 | 1 |
| −1 | 0.794 | 0.891 |
| −3 | 0.501 ≈ ½ | 0.708 ≈ $\sqrt{½}\sqrt{}$ |
| −6 | 0.251 ≈ ¼ | 0.501 ≈ ½ |
| −10 | 0.1 | 0.316 2 |
| −20 | 0.01 | 0.1 |
| −30 | 0.001 | 0.031 62 |
| −40 | 0.000 1 | 0.01 |
| −50 | 0.000 01 | 0.003 162 |
| −60 | 0.000 001 | 0.001 |
| −70 | 0.000 000 1 | 0.000 316 2 |
| −80 | 0.000 000 01 | 0.000 1 |

| dB | Power ratio | Amplitude ratio |
|---|---|---|
| −90 | 0.000 000 001 | 0.000 031 62 |
| −100 | 0.000 000 000 1 | 0.000 01 |

An example scale showing power ratios x, amplitude ratios $\sqrt{x}$, and dB equivalents $10 \log_{10} x$ There are different alternatives to implement the UFAP calculations, as can be appreciated by those skilled in the art. The alternatives depend on the amplifier properties and can be implemented on a common/global scale.

UFAP=function (SAP, AAP)

In most cases, once the system knows what the real-time global audio power is, it can maintain it automatically by adjusting the Amp level and the Compression Parameters. The best implementation includes making the volume requests (from the remote control) increase or decrease the UFAP first, resulting in a coordinate change on the amp level and the compression. Then, the system prevents audio from being too high or too low toward the requested UFAP level. For example, in the following case using the formulas from the last figure VdB=10*log(PowerRatio):
If x is the decibel level
Power Ratio=10^(x/10) SAP=Amplitute=√(10^(x/10))
For instance:

0 dB::SAP=1

−10 dB::SAP=0.3162

−100 dB::SAP=0.00001

In this case, if amplifier volume evolves in 51 steps, the amplifier may behave in a linear fashion where a "0" level is equated with silence and a value of "50" is fifty times louder than a value of "1".
If x is the decibel level and y the amp volume SAP=√(10^(x/10))

AAP=y

UFAP=√(10^(x/10))*y

This is because SAP in this case is in [0-1] and AAP in [0-51], UFAP is in [0-51]. Therefore, in this system, the user controls the UFAP first. For instance, using his remote control, a user sets the global volume to 15 (UFAP=15). In this case, the system should adapt to render a compressed sound around this level.

In another example: AAP=30 and Average SAP=0.5 which means
 resulting amplifier volume is 30
 resulting compression is around −6 dB.

In the above example, for ease of understanding, it was assumed that the method was based on the AAP calculation which depends on the amplifier hardware, its knowledge, and its interface. However, a more complex method can be explored below which does not imply any assumptions about the amplifier properties.

In this example, a system or systems with no advanced control on the amplifier volume is assumed. In such a case, it may not be technically possible to calculate the AAP and UFAP, however it will be possible to make a somewhat less accurate system by just knowing when the user has increased or decreased the volume. To make this easier to understand, the parameters (variables and constants) are provided in bold typeface to differentiate them in the calculations.

In the first scenario, a television set is used that is switched "ON". In this case, the Quiet-Mode is disabled and the constructor default volume or the last volume is applied (Amp Level). No compression is applied.

In a different scenario, the user activates the Quiet-Mode for the first time. The constructor generic LPF, HPF and a clarity-EQ are applied. The constructor has defined properties which are also applied:
 Default Compression Threshold
 Default Compression Ratio
 Default Generic Compression Attack (generic constant)
 Default Generic Compression Release (generic constant)
 Default Generic Compression Gain (generic constant)
 Default Amplifier Level In one embodiment, the variables can be updated according to the usage statistics but average values would be an improvement. In one embodiment, a small compression may be applied first, and then if not enough or insufficient results are obtained, the level may be increased to correct the deficiencies. Sound Profiling and Content Profiling can prove a more reliable option, in some embodiments, as will be explained later. In this example, a good starting point would be:
 Compression Threshold=−6 dB
 Compression Ratio=5:1

From this point on, a sliding buffer continuously samples the audio track. This sampling aims at analyzing what made the user change the volume, and updating the Compression Ratio. The sliding buffer duration is a generic constant defined by the constructor (8s for instance).

In yet another scenario, the operation takes place in Quiet Mode at all times. This is even when the user is not manipulating the volume; the system monitors the audio signal levels to optimize the compression. For instance, in one embodiment, the processor in the system monitors the Maximum Signal Level. This variable directly updates the Compression Ratio because the difference between the Maximum Signal Level and the Compression Threshold leads to the ratio:

Output=((Input−Threshold)/Ratio)+Threshold

Ratio=(Input−Threshold)/(Output−Threshold)

As provided by the equation above, the target output cannot be the same value as the threshold (0 divisor). In one embodiment, a constant can be added to the target output above (e.g., a little bit higher than the threshold level) because an explosion is often louder than regular speech. In this case a variable can be introduced:
 Compression Light Gain (=Output Threshold), which provides Compression Ratio=(Maximum Signal Level−Compression Threshold)/Compression Light Gain A sample value can then be provided as such:
 Maximum Signal Level=−8 dB
 Compression Threshold=−15 dB
 Compression Light Gain=0.5 dB
 Compression Ratio=(−8−−15)/0.5=14 14:1

The Compression Light Gain is also a variable of the system. Monitoring the volume manipulation may indicate to the system that loud parts aren't compressed sufficiently. In such a case, the system or the processor can decrease the Compression Light Gain to get more Compression Ratio.

At this time the concept of calculating the Maximum Signal Level can be explored. This value cannot be equal to the maximum value found during sampling (this is because if there is a glitch during recording or some exceptional event occurs like at 0.5 dB, this should not become relevant to the calculation.) In this case, again, there can be several alternate implementations as can be appreciated. In one embodiment, the value is permanently calculated using the sliding audio buffer. The following example can provide an arbitrary implementation proposal to aid understanding:

Loud Analysis Duration=500 ms
Loud Analysis Peak Number=50

Even in instances where the audio is not loud, the system analyzes all continuous period of 500 ms, and picks the 50 highest levels and calculates the average value: Temp Representative Level. Then, Maximum Signal Level=max (Maximum Signal Level, Temp Representative Level)

If the time continues, for example for over an hour, and the Maximum Signal Level has not reached the desired value, the system then manages and provides the following variables:

Maximum Signal Level Validity Date
Maximum Signal Level Validity Duration (constant)
Second Max Signal Level
Second Max Signal Level Date In such a case, the Maximum Signal Level is replaced by:

Second Max Signal Level=max (Second Max Signal Level, Loud Representative Level)

If, at the end of Maximum Signal Level Validity Duration, a maximum value is not replaced or does not occur again, then the following condition will be provided:

Maximum Signal Level=Second Max Signal Level

Dates and timers are updated accordingly.

In a situation where the Compression Threshold is always exceeded, the Compression Threshold may become obsolete, especially when threshold is too often exceeded. In such a case, the threshold needs to be increased providing the following parameters:

Maximum Signal Level Validity Duration=10 min.
Compression Threshold Min Usage Ratio=80%
Compression Threshold Cancel Step=1 dB In such a case, if the last 10 min or 80% of the signal peaks occur above the Compression Threshold, then the Compression Threshold value is reduced by +1 dB (if less than −1 dB).

In a different scenario, the user changes the volume with the user interface (i.e. such as his remote control). In such a case, the user may perform several key presses, a long one, or even antagonist ones: Vol+, Vol+, Vol+, Vol−. Before analyzing the signal and updating the compression, the system must Make sure the User is done updating the volume
Identify the global wish: increase or decrease the volume.

A Volume Change Timer can be used to delay the signal analysis, just in case another volume command arrives. To identify the global wish, the system compares the number of Vol+ and Vol−.

In another scenario, the user may mainly increase the volume. The system then analyzes the Sliding Audio Sampling Buffer especially just before and when the user is/was increasing the volume. The Current Average Signal Level of this specific sample is the one he wanted to hear clearly. The Current Average Signal Level is calculated by managing these variables:

Peak Focus Ratio=10%
User Reaction Time=2 s
User Reaction Release Time=3 s

The analysis is applied on the wave form starting 2 s before the user starts to change the volume and ending 3 s after he stops; the compression may not be updated immediately. The Current Average Signal Level is the average level of the 10% of highest peaks of this period. This may be somewhat difficult, especially if the volume change happens at the very beginning of the stream. For a low signal, the Compression Threshold is applied/updated, and the Compression Ratio calculated accordingly:

Compression Threshold=Current Average Signal Level

Compression Ratio=(Max Signal Level Compression Threshold)/Compression Light Ga

For a high signal, the compression parameters do not change—more volume does not mean the system should not smooth the differences.

The manner that the system detects if the current signal is low or high can be explored below. It is often only possible from the beginning of the stream if the system has a real-time audio profiler at its disposal. In other words, a system able to find out what type of sound is currently played. If the beginning renders a music entry, the compression then should not be updated. However, if speech is detected, the update should take place.

If the audio profiler sub-system is not available, the compression system defines a timer: Compression Warm-up Time. Before the timer expires, the current/default parameters are protected and cannot be changed. During Warm-up, however, if the user performs antagonist volume sequences, the warm-up is terminated:

Mainly-Volume-Up and then Mainly-Volume-Down
Mainly-Volume-Down and then Mainly-Volume-Up "Mainly" stands for the key-repeat: "Vol+, Vol−, Vol+, Vol+" for instance. After this Compression Warm-up Time, the Compression Threshold can be updated, followed by the Compression Ratio. If the Current Average Signal Level is higher than the Compression Threshold, it means the loud parts are too compressed. In such a case, the system must augment the value of the Compression Light Gain. In one embodiment, a method to do so can include using a parameter defined as Compression Light Gain Update Step.

Compression Light Gain=Compr. Light Gain+ Compr. Light Gain Update Step

When this value is updated, the Threshold and the Ratio are re-calculated. If the Current Average Signal Level is lower than the Compression Threshold, it means the user wants to hear/understand the sequence: this should be the new reference level. If Current Average Signal Level <Compression Threshold:

Compression Threshold=Current Average Signal Level

Even a mistaken value obtained here is not critical. If the user raises the volume up on a loud signal part, the Compression Threshold becomes very high: the compression behaves as if there were no compression because most of the signal is under the threshold. After this loud sequence, if a quiet one arrives, the user will increase the volume again, and the right compression will be applied.

In yet another scenario, the user mainly decreases the volume. In such a case, after the Compression Warm-up Time, if the Current Average Signal Level is higher than the Compression Threshold, the compression is not strong enough, the Compression Light Gain is updated, followed by the Compression Ratio:

Compression Light Gain=Compr. Light Gain Compression Light Gain Update Step

If the Current Average Signal Level is lower than the Compression Threshold, the system does nothing about the compression.

The scenarios that include exceptions can now be explored while the main purpose is to provide general idea and so every exception cannot be explored here but can be determined by those skilled in the art as can be appreciated.

The following focuses on the main method to update and improve the audio compression. However, some additional steps can be taken to handle special behaviors. For instance, a few users do not use the "mute" button but rather prefer decreasing the volume near to 0. In such a case, applying the previous methodology does not render the system inoperative, but does not achieve the optimal results. In such a case, and others, optimizations can be implemented to resolve such issues as suggested below.

Optimizations—when possible, the audio intelligence should be notified or should check when the video content changes:
  End of a program
  Channel change
  Video launch
  Music file launch
  Advertisement In such cases, implementations should strongly lean on existing parameters and should try to identify new ones. Moreover, advertisement and few program types are known to be extremely compressed and normalized. The system can anticipate with specific default values. As well, VoD has generally a lower volume and more dynamics than Live streams. The system can also learn from genres, tags, times, channels and the like and build Quiet Mode Profiles for devices or users. In addition, the system can also monitor when the audio is cut—in TV menus for instance, or when browsing an Application such as Netflix.

Special attention can be provided when handling a Multi-Band Compressor. The monoband compressor compresses all frequencies with the same parameters. The multi-band can apply different compressions for different frequency ranges. It seems smarter regarding the annoying frequencies. In one embodiment, the method remains the same but is multiplied according to the number of frequency ranges to be treated. However, the multi-band compressor behaves like an EQ and may change what musicians call the color of the sound, especially in the medium frequencies. The EQ figure previously given as example is not a random one: it only improves the speech clarity. In other words, the multi-band compressor is more a music editing master tool. The risk to degrade the original sound quality gets bigger especially with a generic algorithm.

Figure 9:
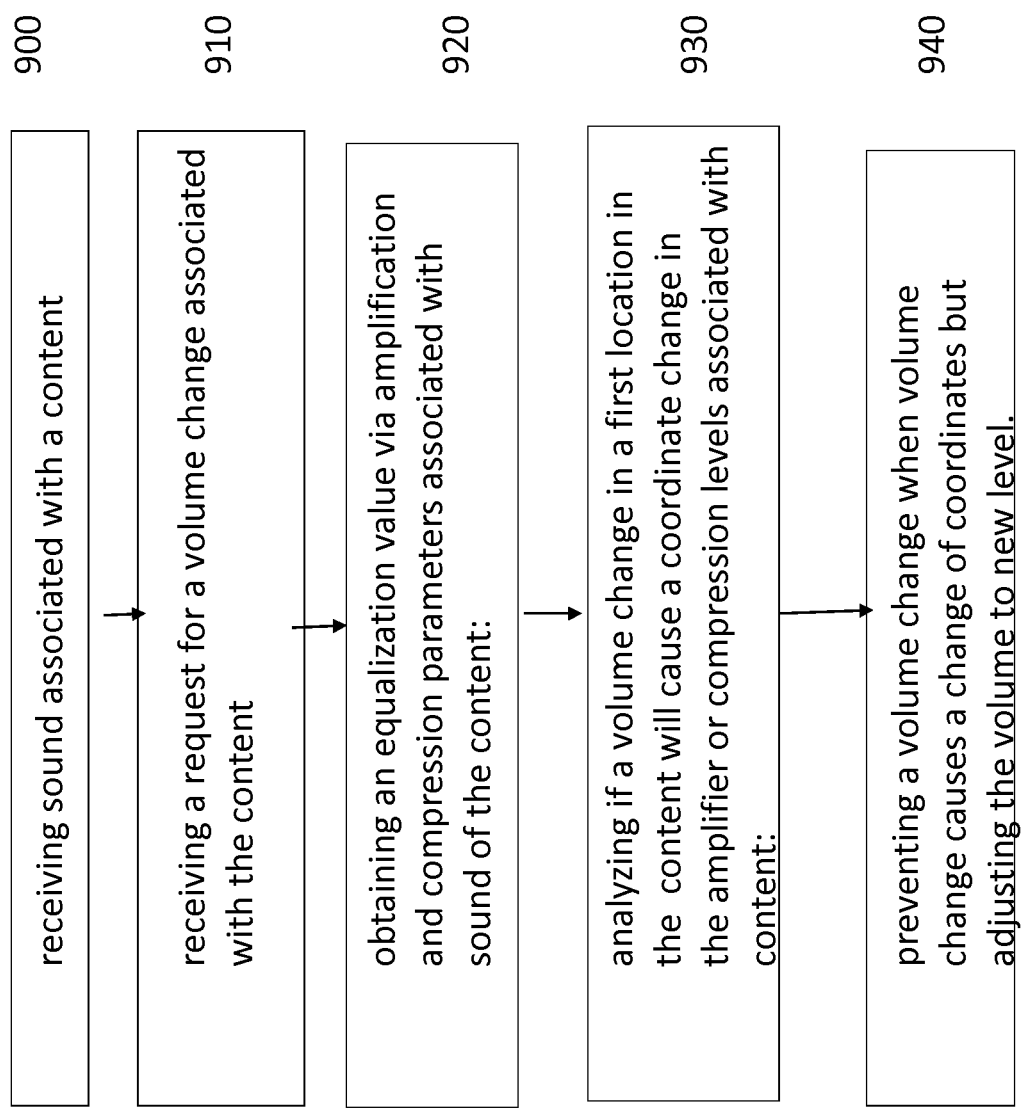
FIG. 9 is a flow chart representation of a methodology according to one embodiment.

FIG. 9 provides an illustration of a flow chart as per one embodiment. In the methodology provided here, a series of steps are provided such as through the use of a processor. In step 900, a sound associated with a content is received. In step 910, a request for a volume change associated with the content is received. In step 920, the amplification and compression parameters associated with sound of the content is obtained. In step 930, if a volume change will cause a coordinate change in the amplifier or compression levels associated with the content, then the volume change is prevented but adjusting the volume to a level that does not cause such a change is allowed.

FIG. 10 provides another flowchart illustration. In step 1000, a video segment is received that has an associated audio. An optimal equalization ratio is then calculated in step 1010 based on a compression and an amplification parameter(s) (i.e. ratio) In one embodiment this can be obtained through analyzing the attenuation of the levels of different frequencies in a signal associated with the content. In step 1020, a plurality of checkpoints are established during video segment and measuring compression and equalization values prior to, and after, each checkpoint. Finally, in step 1030, the compression, amplification and/or equalization values (with determined optimal compression and equalization ratios and adjustment of said audio values) after each checkpoint are adjusted accordingly so that they can remain within the desired optimal ratio. In one embodiment, the user can initiate the audio adjustment. In another embodiment, checkpoint(s) (also optimal compression ratio and equalization ratios) are established and modified after registering a first number of user initiated audio adjustment commands. In another embodiment, the checkpoints include an end of a scene or program within the video segment. It should also be noted that the video, or any content in some embodiments, can include live video or television broadcast stream. In the latter, a checkpoint may include a change in a channel. In many other embodiments, a checkpoint may comprise the beginning or end of an advertisement segment. It is then analyzed whether a volume change will cause a coordinate change in the amplifier or compression levels associated with the content. In this way, it is analyzed as to whether a volume change will cause a coordinate change in the amplifier or compression levels associated with the content and, if so, the volume change is limited or prevented all together.

While some embodiments have been described, it will be understood that those skilled in the art, both now and in the future, may make various improvements and enhancements which fall within the scope of the claims which follow.

The invention claimed is:

1. A method comprising:
   receiving an audio stream associated with a media content;
   receiving a request to be used for a requested volume change associated with said media content;
   determining one or more parameters of an audio compression filter to be applied to said audio stream;
   analyzing if said requested volume change will cause a change of at least one of the parameters of said audio compression filter;
   determining whether the requested volume change is above a volume threshold;
   reducing a dynamic range of said audio stream to adapt volume of the media content if said requested volume change is determined to be above the volume threshold; and
   adjusting the volume threshold to the requested volume change if said requested volume change is determined to be below the volume threshold.

2. The method of claim 1, wherein said media content is a video segment having an associated audio.

3. The method of claim 1, wherein the dynamic range of said audio stream is adapted to a quiet environment level if said requested volume change is not above the volume threshold.

4. The method of claim 1, wherein a plurality of checkpoints are established during a video segment, wherein said volume and audio compression parameters are obtained prior to and after each checkpoint and said dynamic range is adjusted accordingly.

5. The method of claim 4, wherein said video segment is a live video stream.

6. The method of claim 4, wherein said checkpoint comprises a beginning or an end of an advertisement segment.

7. The method of claim 1, wherein a minimum and maximum audio level is established.

8. The method of claim 1, wherein user habits are stored in a memory for future reference for determining a preferred user audio level.

9. A non-transitory computer-readable medium storing computer executable instructions executable to perform the method of claim 1.

10. The method of claim 1, wherein the adjusted volume threshold is to be used for determining whether to further reduce the dynamic range of said audio stream based on comparing a further requested volume change with the adjusted volume threshold.

11. An apparatus comprising:
one or more processors configured for:
receiving an audio stream associated with a media content;
receiving a request to be used for a requested volume change associated with said media content;
determining one or more parameters of an audio compression filter to be applied to said audio stream;
determining whether the requested volume change is above a volume threshold;
reducing a dynamic range of said audio stream to adapt volume of the media content if said requested volume change is determined to be above the volume threshold; and
adjusting the volume threshold to the requested volume change if said requested volume change is determined to be below the volume threshold.

12. The apparatus of claim 11, wherein said one or more processors are further configured for providing audio compression parameters by obtaining an audio power of a source signal and an audio power of an amplifier signal.

13. The apparatus of claim 12, wherein said audio compression parameters can be aggregated to provide a User-Felt Audio Power (UFAP).

14. The apparatus of claim 13, wherein the request to be used for the requested volume change is provided by a user interface.

15. The apparatus of claim 11, wherein real-time global audio power is obtained so as to continually adjust dynamic range.

16. The apparatus of claim 11, wherein a maximum and minimum value are determined for an audio change.

17. The apparatus of claim 11, wherein a minimum and maximum audio level is established.

18. The apparatus of claim 11, wherein said media content is a video segment having an associated audio.

19. The apparatus of claim 11, wherein the dynamic range of said audio stream is adapted to a quiet environment level if said requested volume change is not above the volume threshold.

20. The apparatus of claim 11, wherein user habits are stored in a memory for future reference for determining a preferred user audio level.

21. The apparatus of claim 18, wherein said video segment is a live video stream.

22. The apparatus of claim 11, wherein the adjusted volume threshold is to be used for determining whether to further reduce the dynamic range of said audio stream based on comparing a further requested volume change with the adjusted volume threshold.

* * * * *